United States Patent
Yamakage et al.

(10) Patent No.: US 11,050,912 B2
(45) Date of Patent: Jun. 29, 2021

(54) ILLUMINATION DEVICE FOR IMAGE CAPTURING

(71) Applicant: FUJI CORPORATION, Chiryu (JP)

(72) Inventors: Yusuke Yamakage, Anjo (JP); Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/472,373

(22) PCT Filed: Jan. 6, 2017

(86) PCT No.: PCT/JP2017/000274
§ 371 (c)(1),
(2) Date: Jun. 21, 2019

(87) PCT Pub. No.: WO2018/127971
PCT Pub. Date: Jul. 12, 2018

(65) Prior Publication Data
US 2019/0364182 A1  Nov. 28, 2019

(51) Int. Cl.
*H04N 5/225* (2006.01)
*H05K 13/08* (2006.01)
(Continued)

(52) U.S. Cl.
CPC .......... *H04N 5/2256* (2013.01); *F21V 5/002* (2013.01); *F21V 23/0407* (2013.01);
(Continued)

(58) Field of Classification Search
CPC .. H05K 13/0812; H04N 5/2256; F21V 5/002; F21V 23/0407; F21V 23/0435
See application file for complete search history.

(56) References Cited

U.S. PATENT DOCUMENTS 5,991,039 A * 11/1999 Fujishiro ............ H05K 13/0812
356/614
6,040,895 A *  3/2000 Haas ................... H05K 13/0812
355/70

(Continued)

FOREIGN PATENT DOCUMENTS

JP        8-219739 A    8/1996
JP       11-224784 A    8/1999

(Continued)

OTHER PUBLICATIONS

International Search Report dated Mar. 28, 2017 in PCT/JP2017/000274 filed Jan. 6, 2017.

*Primary Examiner* — Rajarshi Chakraborty
*Assistant Examiner* — Nathaniel J Lee
(74) *Attorney, Agent, or Firm* — Oblon, McClelland, Maier & Neustadt, L.L.P.

(57) ABSTRACT

An illumination device configured to illuminate an imaging target, an image of which is to be captured by a camera, provided with a current adjusting device configured to adjust a current flowing through the LEDs of four LED-mounted boards on which many of the LEDs are mounted, wherein the four LED-mounted boards are arranged in a four-sided shape centered around the light axis of the camera as viewed from the imaging target, and each of the LED-mounted boards is inclined at a specified angle so that the LEDs of the LED-mounted boards face the imaging target. The current adjusting device is configured to divide an LED-mounted area of each of the LED-mounted boards into multiple illumination areas and to individually adjust the current flowing to the LEDs of each of the LED-mounted boards for each of the multiple illumination areas.

5 Claims, 6 Drawing Sheets

(51) Int. Cl.
 *F21V 5/00* (2018.01)
 *F21V 23/04* (2006.01)
 *G03B 15/05* (2021.01)
 *F21Y 107/50* (2016.01)

(52) U.S. Cl.
 CPC .......... *F21V 23/0435* (2013.01); *G03B 15/05* (2013.01); *H05K 13/0812* (2018.08); *F21Y 2107/50* (2016.08)

(56) References Cited

U.S. PATENT DOCUMENTS

| | | | |
|---|---|---|---|
| 6,542,238 B1* | 4/2003 | Tsuboi | H05K 13/0812 356/401 |
| 2005/0238222 A1* | 10/2005 | Nakano | H05K 13/0812 382/151 |
| 2012/0262567 A1 | 10/2012 | Tsuboi et al. | |
| 2015/0084536 A1* | 3/2015 | Shum | H05B 41/34 315/240 |
| 2015/0355527 A1 | 12/2015 | Takahashi et al. | |

FOREIGN PATENT DOCUMENTS

| | | |
|---|---|---|
| JP | 2005-327968 A | 11/2005 |
| JP | 2013-156347 A | 8/2013 |
| JP | 2015-106603 A | 6/2015 |
| JP | 2015-225764 A | 12/2015 |
| WO | WO 2014/103954 A1 | 7/2014 |

\* cited by examiner

ILLUMINATION DEVICE FOR IMAGE CAPTURING

TECHNICAL FIELD

The present disclosure relates to an illumination device for image capturing configured to use many LEDs arranged around a light axis of a camera to illuminate an imaging target, an image of which is to be captured by the camera, which is loaded on a component mounter, an outer appearance inspection machine, or the like.

BACKGROUND ART

For an illumination device for image capturing of a component mounter, it is desirable, for example, to arrange LEDs on a dome-shaped surface centered around the center of an imaging target, such that the distance from the center of the imaging target (an intersection point with the light axis of the camera) to each LED is substantially equal. However, because it is difficult to form a dome-shaped board on which to mount the LEDs, and difficult to mount many of the LEDs at high accuracy on the dome-shaped board, as disclosed in patent literature 1 (JP-A-2015-106603), in many cases, a total of twenty-four LED-mounted boards are arranged in an octagonal bowl shape.

With such a configuration, there is a large quantity of LED-mounted boards, and the configuration for attaching the LED-mounted boards is complex, which leads to disadvantages such as increased manufacturing costs and a larger space in which to set the illumination device being required.

For this, as disclosed in patent literature 2 (JP-A-2005-327968), four LED-mounted boards are arranged in a four-sided shape centered around a light axis of a camera, and to improve the image recognition accuracy for each bump (half-spherical terminals) of BGA components as an imaging target, each LED is arranged such that an illumination level of an outer circumferential section of each bump is higher than an illumination level of a center section, and the entire circumference of the outer circumferential section of each bump is illuminated evenly.

CITATION LIST

Patent Literature

Patent literature 1: JP-A-2015-106603
Patent Literature 2: JP-A-2005-327968

BRIEF SUMMARY

Technical Problem

However, with the configuration of patent literature 2, because each LED is arranged such that an illumination level of an outer circumferential section of each bump of a BGA component as an imaging target is higher than an illumination level of a center section, and the entire circumference of the outer circumferential section of each bump is illuminated evenly, imaging targets are limited to components with bumps such as BGA components, other types of components cannot be illuminated, so the versatility is poor. Further, even for components with bumps, due to differences in the sizes of components and positions of bumps, there are cases in which the outer circumferential section of each bump is not illuminated evenly across the entire circumference, thereby lowering the image recognition accuracy of the bumps.

Solution to Problem

To solve the above problems, disclosed herein is an illumination device for image capturing configured to illuminate an imaging target, an image of which is to be captured by a camera, using many LEDs arranged around a light axis of the camera, the illumination device for image capturing including: four LED-mounted boards on which many LEDs are mounted; a current adjusting device configured to adjust a current flowing through the LEDs of the four LED-mounted boards, wherein the four LED-mounted boards are arranged in a four-sided shape centered around the light axis of the camera as viewed from the imaging target, and each of the LED-mounted boards is inclined at a specified angle so that the LEDs of the LED-mounted boards face the imaging target, and the current adjusting device is configured to divide an LED-mounted area of each of the LED-mounted boards into multiple illumination areas and to individually adjust the current flowing to the LEDs of each of the LED-mounted boards for each of the multiple illumination areas.

With this configuration, because the illumination device is configured with four LED-mounted boards arranged in a four-sided shape, the configuration of the illumination device is simple, low-cost, and space-saving. Further, because the LED-mounted areas of each LED-mounted board are divided into multiple illumination areas and the current adjusting device adjusts the current flowing to the LEDs of each LED-mounted board individually for each illumination area, it is possible to adjust the brightness level of the illumination light of each illumination area with respect to the imaging target individually for each illumination area by performing current adjustment for each illumination area, so the variance in the illumination light due to differences in the position of the illumination area can be corrected, and it is possible to adjust the brightness level of the illumination light of each illumination area in accordance with the type of imaging target, thereby improving the versatility of the illumination device.

In this case, a lens plate that causes a light axis of each of the LEDs in each of the illumination areas to face towards the center of the imaging target may be provided on each of the LED-mounted boards. Accordingly, it is possible to use the light of each LED of each illumination area efficiently as illumination light for the imaging target.

Further, surface texturing processing may be performed on the lens plate. The surface texturing appropriately diffuses light of each LED so that illumination light is applied to the imaging target without fine unevenness.

Also, when adjusting the current flowing to the LEDs on each of the LED-mounted boards individually for each illumination area using the current adjusting device, by causing a larger current to flow the further a distance the illumination area is from the center of the imaging target, the brightness level of illuminating light of each of the illumination areas may be made even with respect to the imaging target. Accordingly, even with a configuration in which four LED-mounted boards are arranged in a four-sided shape, it is possible to make the brightness level of the illumination light of each illumination area even with respect to the imaging target.

Further provided may be a pulse lighting control section configured to cause the LEDs of each illumination area to perform pulse lighting in synchronization with a shutter timing of the camera, and to change a duty of the pulse lighting of each of the illumination areas individually for each of the illumination areas in accordance with a type of the imaging target. Accordingly, because it is possible to save electricity by performing pulse lighting and to increase variation in the illumination with respect to the imaging target, more appropriate illumination can be realized in accordance with the type of imaging target.

Also, further provided may be an illumination pattern changing section configured to change an illumination pattern that is a pattern combining an illumination area for which LEDs of each of the LED-mounted boards are made to turn on and an illumination area for which LEDs of each of the LED-mounted boards are made not to turn on, in accordance with the type of the imaging target. In this case, too, because it is possible to increase variation in the illumination with respect to the imaging target, more appropriate illumination can be realized in accordance with the type of imaging target.

Further provided may be an image processing device configured to process an image captured by the camera, and an illumination mode switching section configured to switch to and from a production illumination mode in which the camera captures an image of the imaging target with the imaging target illuminated with the current adjusted by the adjusting device flowing to the LEDs of each of the illumination areas during production, and a current adjusting illumination mode in which the current flowing to the LEDs in each of the illumination areas is adjusted by the current adjusting device individually for each of the illumination areas while production is stopped, and the current adjusting device may be configured to, in the current adjusting illumination mode, switch the order in which the illumination areas for which the LEDs of each of the LED-mounted boards are turned on one by one, use the camera to capture an image of a reference jig as an imaging target illuminated with one of the illumination areas, use the image processing device to process the image, and determine a brightness level of a reference jig portion of the image, then perform processing to adjust the current flowing to the LEDs on that illumination area such that the brightness level of the reference jig portion becomes a specified reference brightness level, so as to adjust current flowing to the LEDs of each of the illumination areas individually for each of the illumination areas such that the brightness level of the illumination light of each of the illumination areas with respect to the reference jig is even. Accordingly, by periodically switching to the current adjusting illumination mode, it is possible to correct the variation in the illumination light caused by changes over time to the LEDs of each illumination area.

DESCRIPTION OF EMBODIMENTS

The following describes a specific embodiment using a component mounter. First, the configurations of camera 11 and illumination devices 12 and 13 are described using FIGS. 1 to 3. Although not shown, camera 11 and illumination devices 12 and 13 are attached facing up in a component mounter, such that a component (imaging target) picked up by a suction nozzle of the component mounter is illuminated from below by illumination devices 12 and 13 and imaged by camera 11.

Figure 1:
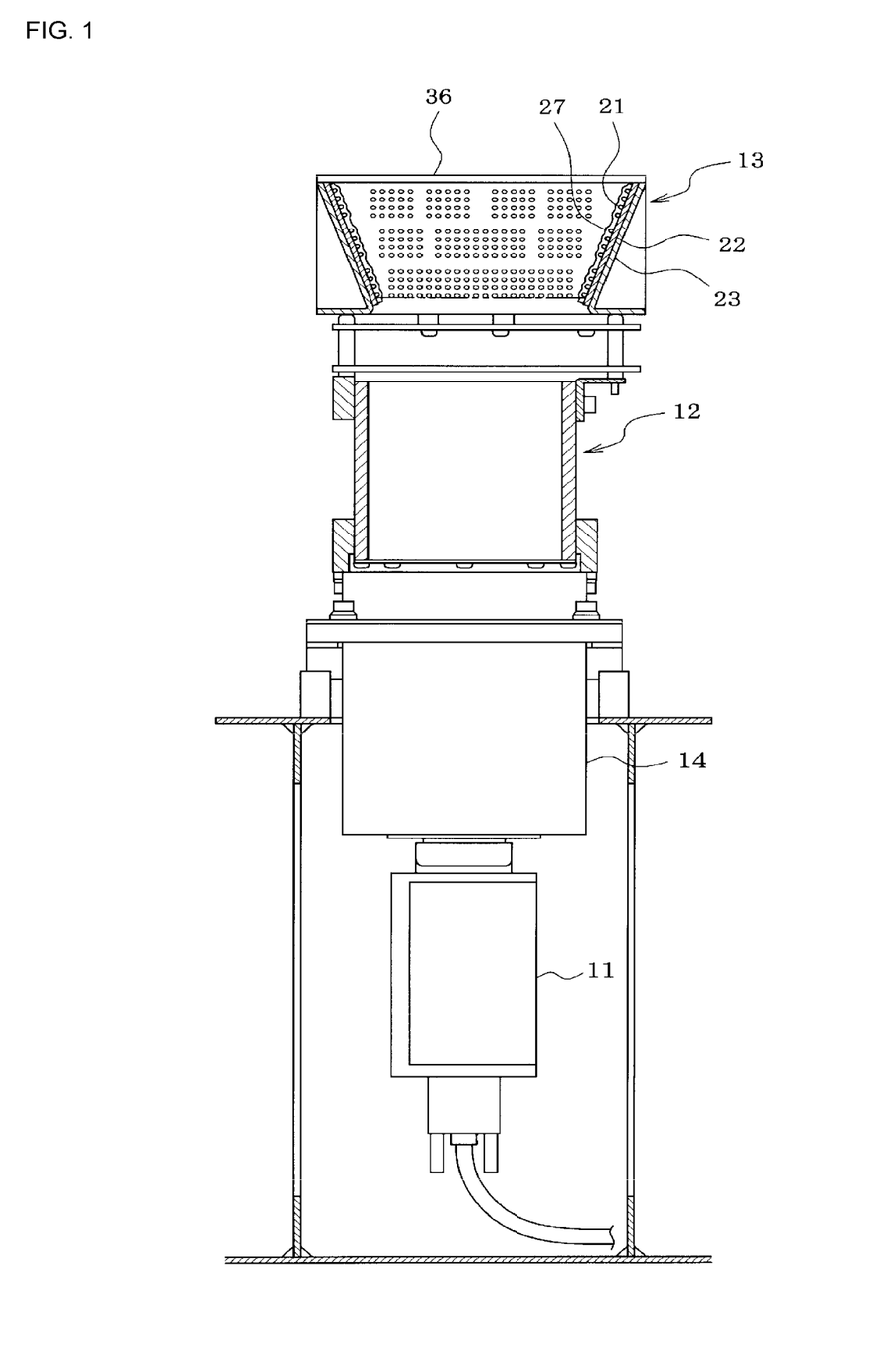
FIG. 1 is a cross section showing an attachment configuration of a camera and an illumination device of an embodiment of the disclosure.

Lens unit 14 is provided above camera 11, and illumination device 13 for side illumination (side illumination device) is provided above lens unit 14 via illumination device 12 for coaxial incident illumination. Although not shown, illumination device 12 for coaxial incident illumination is configured including items such as a light emitting source of LEDs or the like that emit light in a horizontal direction towards the center of illumination device 12 from the side of illumination device 12 (that is, the light axis of camera 11), and a half mirror that reflects light from the lighting emitting source towards the imaging target above.

Figure 2:
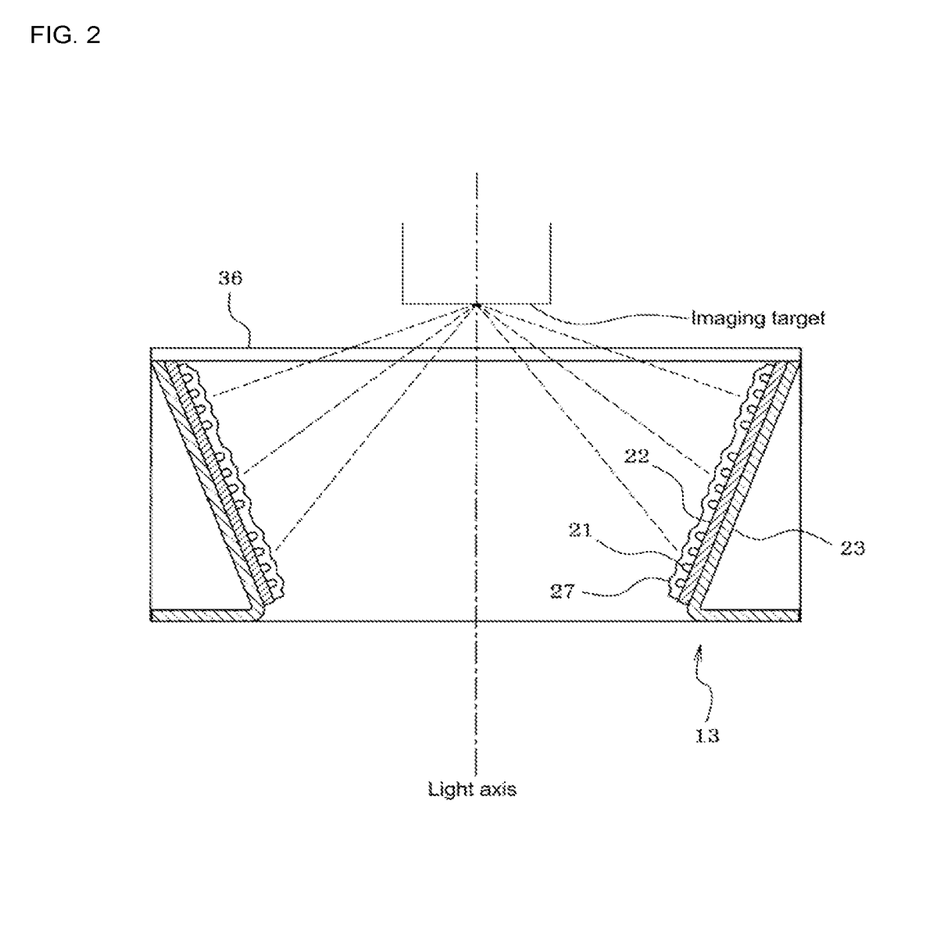
FIG. 2 is a cross section showing the configuration of an illumination device for side illumination.
Figure 3:
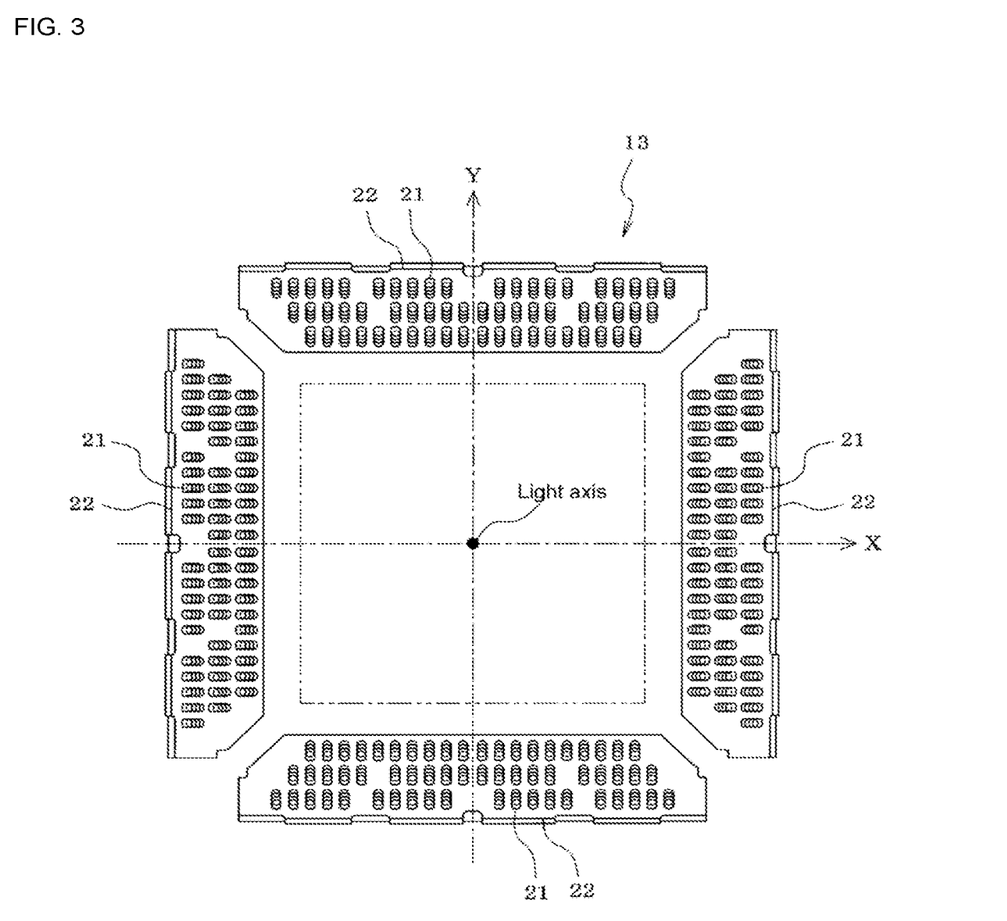
FIG. 3 is a plan view showing the configuration of the illumination device for side illumination in a state with the lens plate removed.

As shown in FIGS. 2 and 3, on the one hand, illumination device for side illumination 13 is configured with four LED-mounted boards 22, on which are mounted many LEDs 21, arranged in a four-sided shape centered around the light axis of camera 11 as viewed from the imaging target, and each of the LED-mounted boards 22 is inclined at a specified angle so that the LEDs 21 of the LED-mounted boards 22 face the imaging target, with the LED-mounted boards 22 being attached to attachment member 23.

Figure 4:
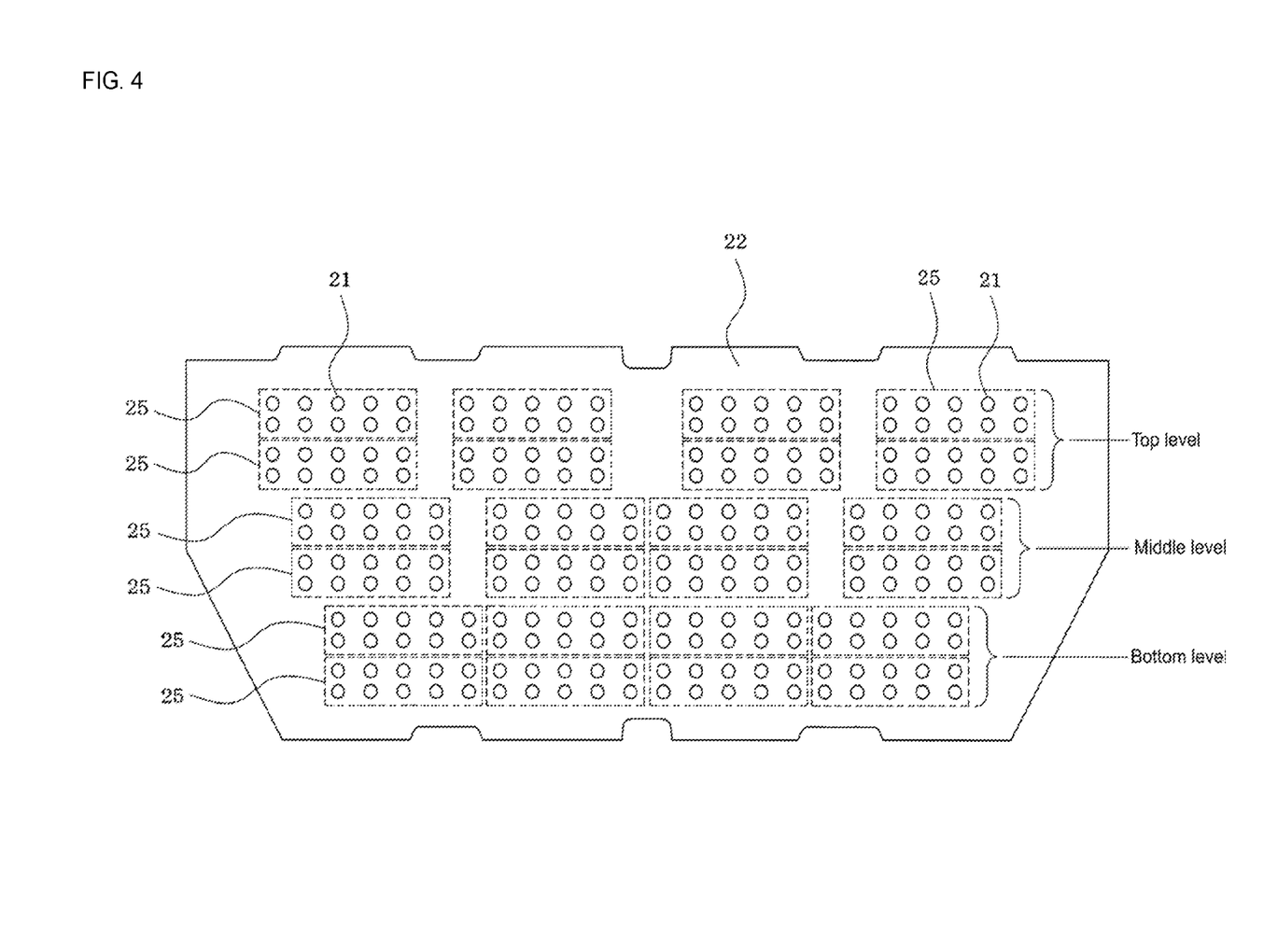
FIG. 4 shows an arrangement pattern of the illumination areas of an LED-mounted board.

As shown in FIG. 4, the LED-mounted areas of each LED-mounted board 22 are divided into multiple illumination areas 25, and current adjusting device 26 (refer to FIG. 5) is provided to adjust the current flowing to LEDs 21 of each LED-mounted board 22 individually for each illumination area 25. A specified quantity of LEDs 21, for example, ten (a 2×5 grid) is mounted on each illumination area 25, and the ten LEDs 21 of each illumination area 25 are connected serially by wiring (not shown). The arrangement pattern of illumination areas 25 of each LED-mounted board 22, in the example of FIGS. 3 and 4, may be, for example, an arrangement of illumination areas 25 with three levels, top, middle, and bottom, each level being split into an upper and lower section; thus, each level has a specified quantity of illumination areas 25, for example, a grid of 4×2 for a total of eight; however, this arrangement pattern is a non-limiting example and may be changed as appropriate.

As shown in FIG. 2, lens plate 27 that causes a light axis of each of the LEDs 21 of each illumination area 25 to face towards the center of the imaging target is provided on each LED-mounted board 22, and due to this lens plate 27, the light of LEDs 21 of each illumination area 25 is used effectively as illumination light for the imaging target. Lens plate 27 is formed of transparent material such as transparent resin and surface texturing processing has been performed on the surface of lens plate 27. The surface texturing appropriately diffuses light of each LED 21 so that illumination light is applied to the imaging target without fine unevenness. LED-mounted boards 22 are shown in FIGS. 3 and 4 in a state with lens plate 27 removed.

Figure 5:
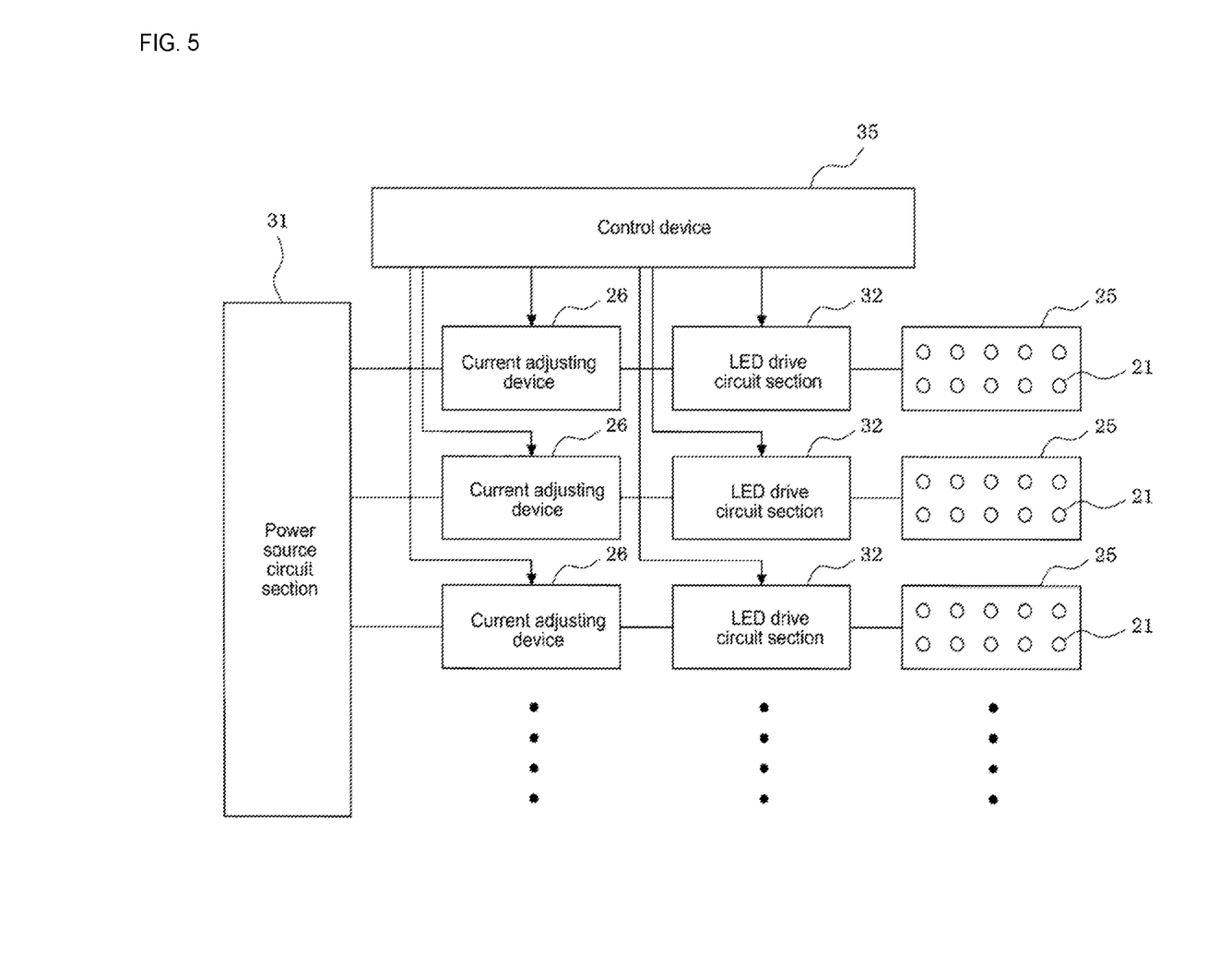
FIG. 5 is a block diagram showing the electrical configuration of the illumination device for side illumination.

As shown in FIG. 5, the electric current supplied from power source circuit section 31 is individually adjusted for each illumination area by current adjusting device 26, and by turning the current flowing to LEDs 21 of each illumination area 25 on and off using LED drive circuit section 32, LEDs 21 of each illumination area 25 are switched on and off.

However, in the present embodiment, with the configuration of four LED-mounted boards arranged in a four-sided shape, the distance between each illumination area 25 of the LED-mounted boards 22 and the center of the imaging target (intersection with the light axis of the camera) is not uniform, actually, the distance to the center of the imaging target increases the further the illumination area 25 is from the center of the LED-mounted board 22 in the sideways direction. The brightness level with which the light of LEDs 21 of each illumination area 25 of LED-mounted board 22 illuminates the imaging target is inversely proportional to the distance between the two, thus, if the LEDs of each illumination area 25 of the LED-mounted board 22 are caused to emit light by the same current, the brightness level with which the imaging target is illuminated will decrease the further the illumination area 25 is from the center of the LED-mounted board 22.

Thus, with the present embodiment, when adjusting the current flowing to LEDs 21 on each of the LED-mounted boards 22 individually for each illumination area 25 using current adjusting device 26, by causing a larger current to flow the further a distance the illumination area 25 is from the center of the imaging target, the brightness level of illuminating light of each of the illumination areas 25 is made even with respect to the imaging target. Accordingly, even with a configuration in which four LED-mounted boards 22 are arranged in a four-sided shape, it is possible to make the brightness level of the illumination light of each illumination area 25 even with respect to the imaging target.

Also, in the present embodiment, each LED drive circuit section 32 may function as an illumination pattern changing section configured to change an illumination pattern that is a pattern combining an illumination area 25 for which LEDs 21 of each of the LED-mounted boards 22 are made to turn on and an illumination area 25 for which LEDs of each of the LED-mounted boards 22 are made not to turn on, in accordance with the type of the imaging target. Accordingly, for example, in accordance with the type of imaging target, the illumination pattern may be changed, such as only one level of the illumination areas 25 out of the top, middle, and bottom layers of each LED-mounted board 22 may be turned on, or any two levels of the illumination areas 25 may be turned on, or all three of the levels of the illumination areas 25 may be turned on, or only one of the upper or lower sections of each level of the illuminations areas 25 may be turned on; in this manner, the variations in illumination with respect to the imaging target can be increased, and appropriate illumination can be realized in accordance with the type of imaging target.

Figure 6:
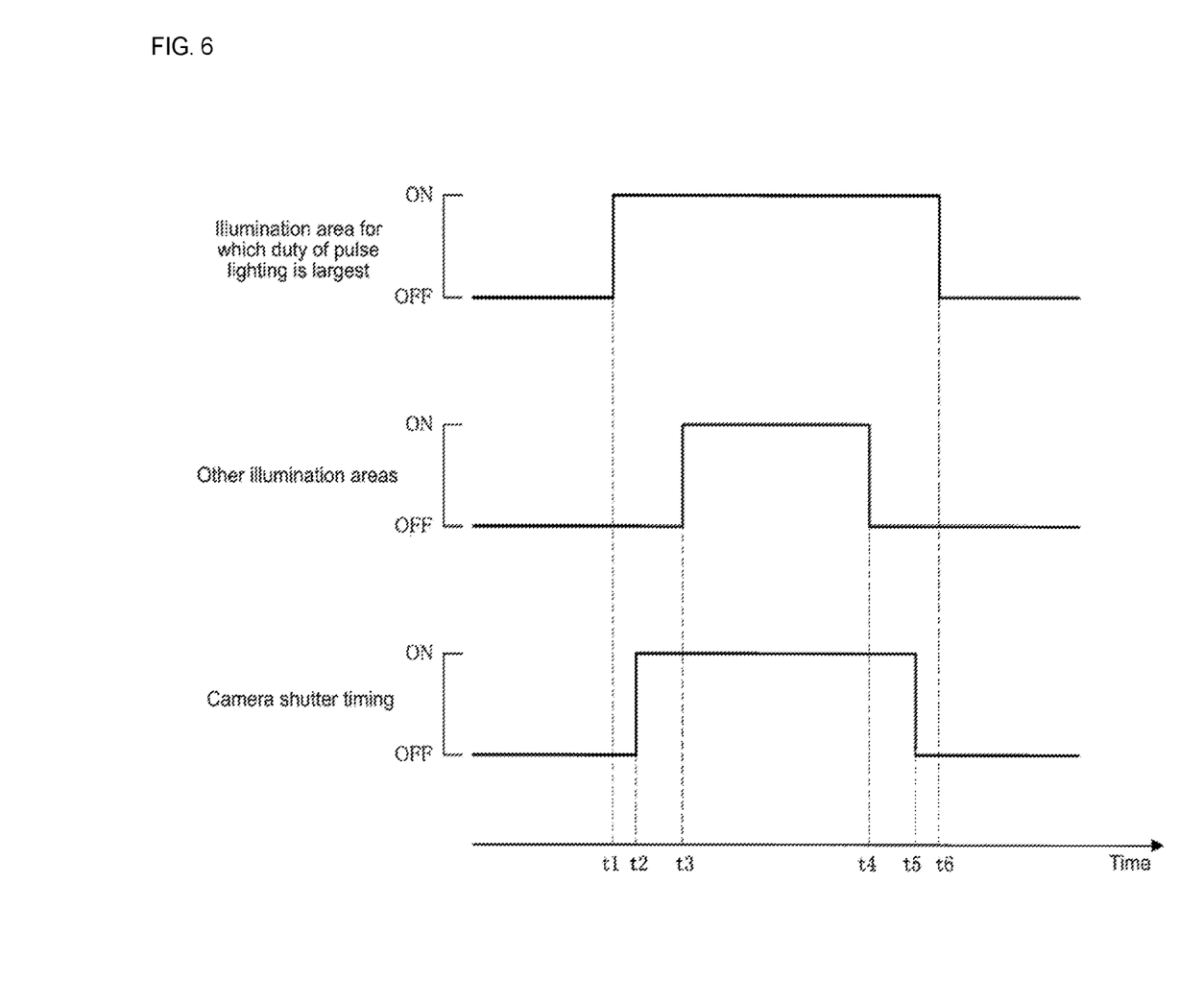
FIG. 6 is a time chart illustrating an example of individually changing the duty of the pulse lighting of each illumination area.

Further, as shown in FIG. 6, each LED drive circuit section 32 may function as a pulse lighting control section configured to cause the LEDs 21 of each illumination area 25 to perform pulse lighting in synchronization with a shutter timing of camera 11, and to change a duty (on time of LED 21) of the pulse lighting of each of the illumination areas 25 individually for each of the illumination areas 25 in accordance with a type of the imaging target.

In this case, as shown in FIG. 6, among the multiple illumination areas 25 to perform pulse lighting, on timing t1 of LEDs 21 of illumination area 25 for which the pulse lighting duty is largest may be directly before shutter opening timing t2 of camera 11, and off timing t6 of LEDs 21 of that illumination area 25 may be directly after shutter closing timing t5 of camera 11, such that the duty t1 to t6 of the pulse lighting of that illumination area 25 is slightly longer than the shutter open time t2 to t5 of camera 11. On and off timing t3 and t4 of LEDs 21 of other illumination areas 25 may be within the shutter open time t2 to t5 of camera 11, such that the duty t3 to t4 of the pulse lighting of the other illumination areas 25 is slightly shorter than the shutter open time t2 to t5 of camera 11.

In this manner, by performing pulse lighting of LEDs 21 of each illumination area 25 in synchronization with the shutter timing of camera 11, as well as saving electricity consumption of illumination device 13, by changing the duty of the pulse lighting of each illumination area 25 individually for each illumination area 25 in accordance with the type of imaging target, it is possible to increase the variations in illumination with respect to the imaging target, and to realize more appropriate illumination.

As shown in FIG. 5, operation of LED drive circuit section 32 and current adjusting device 26 of each illumination area 25 is controlled by control device 35 of the component mounter. Control device 35 of the component mounter functions as an image processing device that recognizes the imaging target (component) by processing the image captured by camera 11.

Further, control device 35 of the component mounter functions as an illumination mode switching section configured to switch the illumination mode of illumination device 13 to and from a production illumination mode and a current adjusting illumination mode, and during operation (during production) of the component mounter, the production illumination mode is used, with camera 11 capturing images with the imaging target illuminated by LEDs 21 of each illumination area 25 through which current adjusted by each current adjusting device 26 is flowing, and the images being processed to recognize the target objects.

Control device 35 of the component mounter switches the illumination from the production illumination mode to the current adjusting illumination mode periodically while production is stopped to correct the change over time of the light emitting characteristics of LEDs 21 of each illumination area 25. In the current adjusting illumination mode, the order in which the illumination areas 25 for which the LEDs 21 of each of the LED-mounted boards 22 are turned on is switched one by one, camera 11 is used to capture an image of a reference jig (not shown) as an imaging target illuminated with one of the illumination areas 25, control device 35 of the component mounter processes the image, determines a brightness level of a reference jig portion of the image, then performs processing such that current adjusting device 26 adjusts the current flowing to the LEDs 21 on that illumination area 25 such that the brightness level of the reference jig portion becomes a specified reference brightness level for each illumination area 25, so as to adjust current flowing to the LEDs 21 of each of the illumination areas 25 individually for each of the illumination areas 25 such that the brightness level of the illumination light of each of the illumination areas 25 with respect to the reference jig is even. Here, an operator may manually load the reference jig on cover glass 36 or the like on an upper surface of illumination device 13, or a suction nozzle (not shown) of the component mounter may pick up the reference jig and move it above illumination device 13. Alternatively, the reference jig may be provided on a lower surface of the mounting head (not shown) that holds the suction nozzle so as to be moved above illumination device 13.

In this manner, by periodically switching the illumination mode to the current adjusting illumination mode and using current adjusting device 26 to adjust the current flowing to LEDs 21 of each illumination area 25 individually for each illumination area 25 such that the brightness of the illumination of each illumination area 25 with respect to the reference jig is even, it is possible to correct variation over time in the illumination light caused by changes over time to the LEDs 21 of each illumination area 25.

According to an embodiment described above, because illumination device 13 is configured with four LED-mounted boards 22 arranged in a four-sided shape, the configuration of illumination device 13 is simple, low-cost, and space-saving. Further, because the LED-mounted areas of each LED-mounted board 22 are divided into multiple illumination areas and current adjusting device 26 adjusts the current flowing to the LEDs 21 of each LED-mounted board 22 individually for each illumination area 25, it is possible to adjust the brightness level of the illumination light of each illumination area 25 with respect to the imaging target individually for each illumination area 25 by performing current adjustment for each illumination area 25, so the variance in the illumination light due to differences in the position of the illumination area 25 can be corrected, and it is possible to adjust the brightness level of the illumination light of each illumination area 25 in accordance with the type of imaging target, thereby improving the versatility of illumination device 13.

Note that, it goes without saying that the present disclosure is not limited to an illumination device for side illumination of component imaging camera 11 loaded on a component mounter, and various changes that do not extend beyond the scope of the disclosure are possible, such as that an embodiment may be applied to an illumination device for side illumination of a mark imaging camera that captures images of reference marks on the circuit board from above, or, without being limited to a component mounter, for example, an embodiment may be applied to an illumination device for side illumination for a camera loaded on a component shape data creating device for image processing or an external appearance inspection machine.

REFERENCE SIGNS LIST

11: camera;
12: illumination device for coaxial incident illumination;
13: illumination device for side illumination (illumination device for image capturing)
14: lens unit;
21: LED;
22: LED-mounted board;
25: illumination area;
26: current adjusting device;
27: lens plate;
31: power source circuit section;
32: LED drive circuit section (lighting pattern changing section, pulse lighting control section, illumination mode switching section);
35: control device (image processing device)

The invention claimed is:

1. An illumination device for image capturing configured to illuminate an imaging target, an image of which is to be captured by a camera, using many LEDs arranged around a light axis of the camera, the illumination device for image capturing comprising:
    four LED-mounted boards on which many LEDs are mounted;
    a current adjusting device configured to adjust a current flowing through the LEDs of the four LED-mounted boards; and
    a controller configured to control the current adjusting device, wherein
    the four LED-mounted boards are arranged in a four-sided shape centered around the light axis of the camera as viewed from the imaging target,
    each of the LED-mounted boards is inclined at a specified angle so that the LEDs of the LED-mounted boards face the imaging target,
    the current adjusting device is configured to divide an LED-mounted area of each of the LED-mounted boards into multiple illumination areas,
    the controller is configured to individually adjust the current flowing to the LEDs of each of the LED-mounted boards for each of the multiple illumination areas via the current adjusting device,
    the controller is configured to, when adjusting the current flowing to the LEDs on each of the LED-mounted boards individually for each illumination area via the current adjusting device, by causing a larger current to flow the further a distance the illumination area is from the center of the imaging target, make the brightness level of illuminating light of each of the illumination areas even with respect to the imaging target,
    the controller is configured to cause the LEDs of each illumination area to perform pulse lighting in synchronization with a shutter timing of the camera, and
    the controller is configured to change a duty of the pulse lighting of each of the illumination areas individually for each of the illumination areas in accordance with a type of the imaging target.

2. The illumination device for imaging capturing according to claim 1, wherein
    a lens plate that causes a light axis of each of the LEDs in each of the illumination areas to face towards the center of the imaging target is provided on each of the LED-mounted boards.

3. The illumination device for imaging capturing according to claim 2, wherein
    surface texturing processing has been performed on the lens plate.

4. The illumination device for imaging capturing according to claim 1, wherein the controller is configured to change an illumination pattern that is a pattern combining an illumination area for which LEDs of each of the LED-mounted boards are made to turn on and an illumination area for which LEDs of each of the LED-mounted boards are made not to turn on, in accordance with the type of the imaging target.

5. The illumination device for imaging capturing according to claim 1, wherein the controller is configured to:
    process an image captured by the camera,
    switch to and from a production illumination mode in which the camera captures an image of the imaging target with the imaging target illuminated with the current adjusted by the adjusting device flowing to the LEDs of each of the illumination areas during production, and a current adjusting illumination mode in which the current flowing to the LEDs in each of the illumination areas is adjusted by the current adjusting device individually for each of the illumination areas while production is stopped, and
    switch the order in which the illumination areas for which the LEDs of each of the LED-mounted boards are turned on one by one in the current adjusting illumination mode, use the camera to capture an image of a reference jig as an imaging target illuminated with one of the illumination areas, use the image processing device to process the image, and determine a brightness level of a reference jig portion of the image, then perform processing to adjust the current flowing to the LEDs on that illumination area such that the brightness level of the reference jig portion becomes a specified reference brightness level, so as to adjust current flowing to the LEDs of each of the illumination areas individually for each of the illumination areas such that the brightness level of the illumination light of each of the illumination areas with respect to the reference jig is even.

* * * * *